United States Patent [19]

D'Oro et al.

[11] Patent Number: 5,311,157
[45] Date of Patent: May 10, 1994

[54] SYSTEM FOR FILTERING SIGNALS OF HIGH AND LOW FREQUENCY BANDS, AND RELEVANT IMPLEMENTATION DEVICE

[75] Inventors: Enzo C. D'Oro, Monza; Mario Bandera, Carnate, both of Italy

[73] Assignee: Forem S.p.A., Brianza, Italy

[21] Appl. No.: 811,713

[22] Filed: Dec. 20, 1991

[30] Foreign Application Priority Data

Dec. 28, 1990 [IT] Italy ............................. 22558 A/90

[51] Int. Cl.$^5$ .......................................... H01P 1/213
[52] U.S. Cl. ........................................ 333/132; 333/134
[58] Field of Search ............... 333/126, 129, 132, 134

[56] References Cited

U.S. PATENT DOCUMENTS

| | | | |
|---|---|---|---|
| 3,124,768 | 3/1964 | Tilston | 333/126 |
| 3,425,006 | 1/1969 | Wolf | 333/228 |
| 3,611,198 | 10/1971 | Ma | 333/132 |
| 4,910,481 | 3/1990 | Sasaki et al. | 333/134 |
| 5,023,866 | 6/1991 | De Muro | 333/126 X |

FOREIGN PATENT DOCUMENTS

| | | |
|---|---|---|
| 0492304 | 7/1992 | European Pat. Off. . |
| 3917315 | 11/1990 | Fed. Rep. of Germany ...... 333/132 |
| 2534088 | 4/1984 | France . |
| 690578 | 10/1979 | U.S.S.R. ............................. 333/132 |
| 731498 | 6/1955 | United Kingdom . |

OTHER PUBLICATIONS

IEEE Transactions on Microwave Theory and Techniques, vol. 27 No. 12, Dec. 1979, pp. 982-986.

Primary Examiner—Benny Lee

[57] ABSTRACT

A filtering system for separating a composite signal containing two signals in different frequency bands: a high frequency signal and a low frequency signal. The composite signal to be separated is input into an inductive element in a high frequency filter section. The high frequency signal is immediately coupled by mutual induction with a resonant element of the high frequency filter section, the resonant element being designed so that the low frequency signal is not coupled because of the low value of its frequency. The low frequency signal is transmitted to low pass filter section which rejects any signal remaining in the high frequency band.

10 Claims, 3 Drawing Sheets

SYSTEM FOR FILTERING SIGNALS OF HIGH AND LOW FREQUENCY BANDS, AND RELEVANT IMPLEMENTATION DEVICE

BACKGROUND OF THE INVENTION

1. Field of the Invention:

The present invention relates to a filtering system for separating two signals of different frequencies or different frequency bands in a composite signal, one of the signal to be separated being in a relatively low frequency band (e.g., from D.C. to 300 MHz) and the other signal being in a relatively high frequency band (e.g. from 800 Mhz to 20 GHz). The invention also relates to a circuit for installation of this circuit on a wall of a resonant cavity.

2. Description of the Related Art:

Ordinarily, in the telecommunication field, it is convenient to transmit simultaneously, e.g. on a same carrier, such as a cable, two or more signal types, e.g. a high frequency signal that must pass through a pass-band filter and a low frequency signal, that can also include a D.C. level.

For example, FIG. 1a shows the frequency bands S2, e.g. from 0 to about 300 Mhz, and S1, e.g. from 925 to 970 Mhz.

FIG. 1b is a block diagram schematic of a conventional circuit, in which the composite signal S1+S2 is applied to two filters connected in parallel F1A (that allow only band S1 to pass), and F2B, that allows only band S2 to pass.

The technical literature of the prior art discloses many possible circuits to solve this problem. However, these known circuits have many drawbacks, arising in particular from losses, distortion of the bands (especially the high frequency bands), size, cost, etc.

The filtering scheme of FIG. 1b is typically carried out in an embodiment utilizing a low-pass filter F2B with an inductive input, for example the configuration of FIG. 2, in which S1+S2 is applied on the node N that has, at its left side, filter F1A, including substantially a high capacitor C followed by an inductance LH (connected to ground) and, at its right side filter F2B including the inductances L1b, L2b, L3b connected in series and capacitances C1b, C2b, etc. connected in parallel to ground.

The capacitor C prevents the D.C. and low frequencies of S2 from being short-circuited to ground through the input coupling inductance of pass-band filter F1A. The pass-band filter F2B transmits the D.C. and low frequencies.

Even if the above-described prior art circuit can solve the "size" problem, it has many drawbacks, including:

high input capacitance, caused by the sum of C with the capacitances C1b, C2b, etc. of the low-pass filter F2B;

high insertion loss in the high frequency band S1, caused by the fact that the low-pass filter F2B is upstream of, i.e. precedes, the pass-band filter F1A;

the capacitance inserted in series with the input inductance LH of low-pass filter F1A causes a resonance that creates an undesirable attenuation in a band near the bands of the input signal.

SUMMARY OF THE INVENTION

The first object of the invention is to provide a filtering system that solves in the best manner the above mentioned problem, eliminating the drawbacks of the circuits of prior art.

Another object of the invention is to provide a filter structure (a printed circuit filter) that has the following advantageous characteristics:

minimum energy loss for both signals S1 and S2;
minimum capacitance measured at the circuit input;
minimum overall dimensions; and
minimum cost.

These and other objects are obtained by the filter system that includes:

an inductance L acting as input element of the pass-band filter through which the high frequency signal S1 and also the low frequency signal S2 pass;

a resonant cavity or resonator CR containing the inductance L;

the characteristics of the inductance L and cavity CR being suitable for carrying out a reciprocal optimal coupling with the high frequency signal S1 by mutual induction, and virtually no coupling with the low frequency signal S2;

a low-pass filter section F2B for the signal S2, disposed on a printed circuit CST external to the cavity CR, formed by stubs and connection tracks having lengths preferably equal to one fourth of the wavelength of a signal S1;

the signal S1 being filtered by filter section F2B, so that it does not circulate in the low-pass filter section, thereby eliminating possible negative influences of signal S1.

Other characteristics of the system as well as of the relevant implementation filter structure are recited in the claims.

BRIEF DESCRIPTION OF THE DRAWINGS

The various features and advantages of the invention shall become apparent from the description of the preferred (but not limiting) embodiments represented in annexed drawings, in which:

FIG. 1b is a block diagram schematic of a typical prior art circuit for separating the two frequency bands of FIG. 1a.

FIG. 2 is a schematic circuit diagram of a prior art circuit for separating the two frequency bands of FIG. 1a.

DETAILED DESCRIPTION OF THE PREFERRED EMBODIMENT

In the figures, like elements are identified by like reference numbers.

Figure 3:
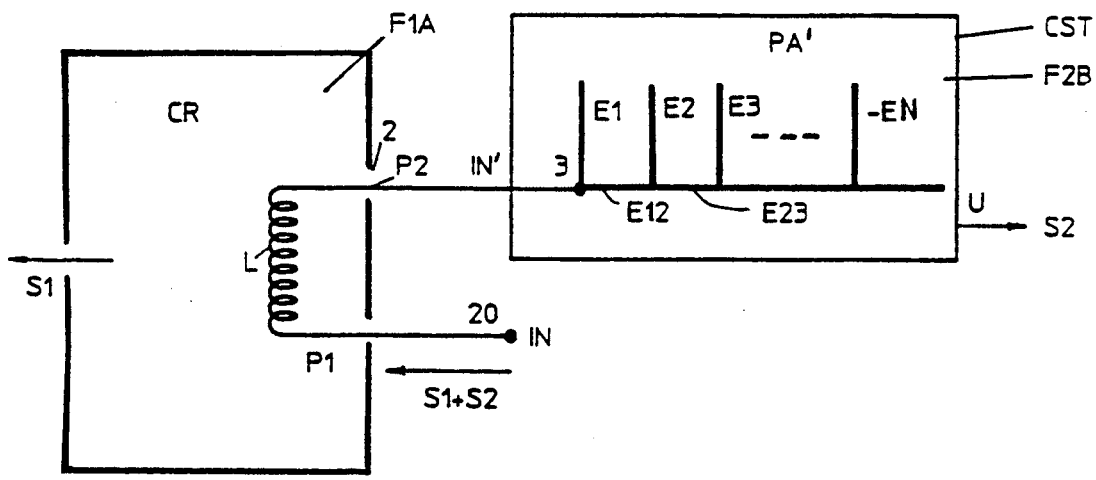
FIG. 3 is a schematic circuit diagram of the filter of the present invention.

FIG. 3 is a schematic of the filter of the invention, including an input IN of the composite signal S1+S2 fed to an inductance L contained in a cavity resonator CR. The combination of L and CR form the high frequency filter section F1A, while the low frequency section F2B includes a printed circuit CST, formed on a card PA, on which n stubs, e.g. E1, E2, E3 ... En are printed, the stubs being connected to one another by tracks E12, E23, etc. The output of S2 is indicated by U.

Generally speaking, the cavity resonator CR1 is the first resonator of filter F1A through which the signal S1 passes and can be of coaxial type, in waveguide form, or a dielectric resonator; what is important is that its input is inductive, that is formed by an inductance L, whose first end P1 is connected to the input connector 20 (shown in FIG. 4A), and whose second end P2 is joined to the input IN' (shown in FIG. 5A) of the filter F2B, through which only the low frequency signal S2 passes.

As mentioned above, the inductance L represents the input element of the pass-band filter F1A through which the high frequency signal S1 passes. The low frequency signal S2 also passes through L, but while S1 is coupled by mutual induction with the resonator CR1 of the filter F1A, S2 is not coupled with CR1 due to the low value of its frequency, and thus travels on to the band-rejection filter F2B.

To obtain an optimal coupling of S1 with F1A, it is necessary that the second end P2 of L be electrically connected to the ground of filter F1A. This is obtained preferably by means of the first stub E1 of the filter F2B having a high impedance and a length equal to one fourth of the wavelength of the signal S1. Filter F2B is formed by two or more stubs E1, E2, E3 ... En, as stated above, which preferably have a length of one fourth of the wavelength of the signal S1, are open circuited at their second ends and are separated by sections of line E12, E23 ....

The average skilled technician will recognize that, in an equivalent manner, the stub E1, due to its electric length, is short circuited to P2 and that the filter F2B highly attenuates the high frequency signal S1 without disturbing the signal S2, that can pass without attenuation.

In the embodiment of FIGS. 4, 4A, 5 and 5A, the filter F2B is of the band-rejection type, but it can also be a low-pass type. The embodiment shown is particularly advantageous with respect to cost, reliability, losses and overall dimensions, because the filter F2B, formed of a printed circuit CST, is consisting of stubs E1, E2, E3 ... $E_n$, and connection elements E12, E23, etc., is mounted on a board, and housed in a recess Ni (see FIGS. 4, 5) formed externally in a wall PA of the cavity resonator CR1 and shielded from the outside by a cover COP screwed to the wall PA.

The inductance L passes out of the cavity CR1, through a hole made in the cavity, and is welded to the printed circuit CST, e.g. at the base of the first stub E1.

Figure 4:
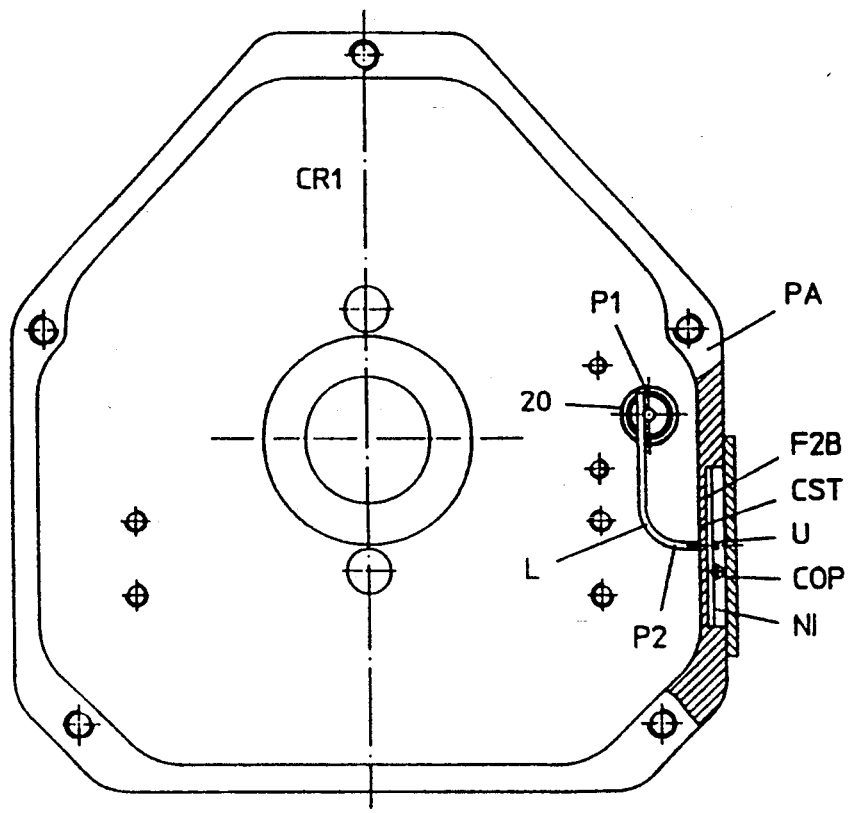
FIG. 4 is a partial section view of a cross plane of a practical embodiment of the filter of the present invention, and of its optimal installation in a part of the wall PA of the cavity CR.
Figure 4A:
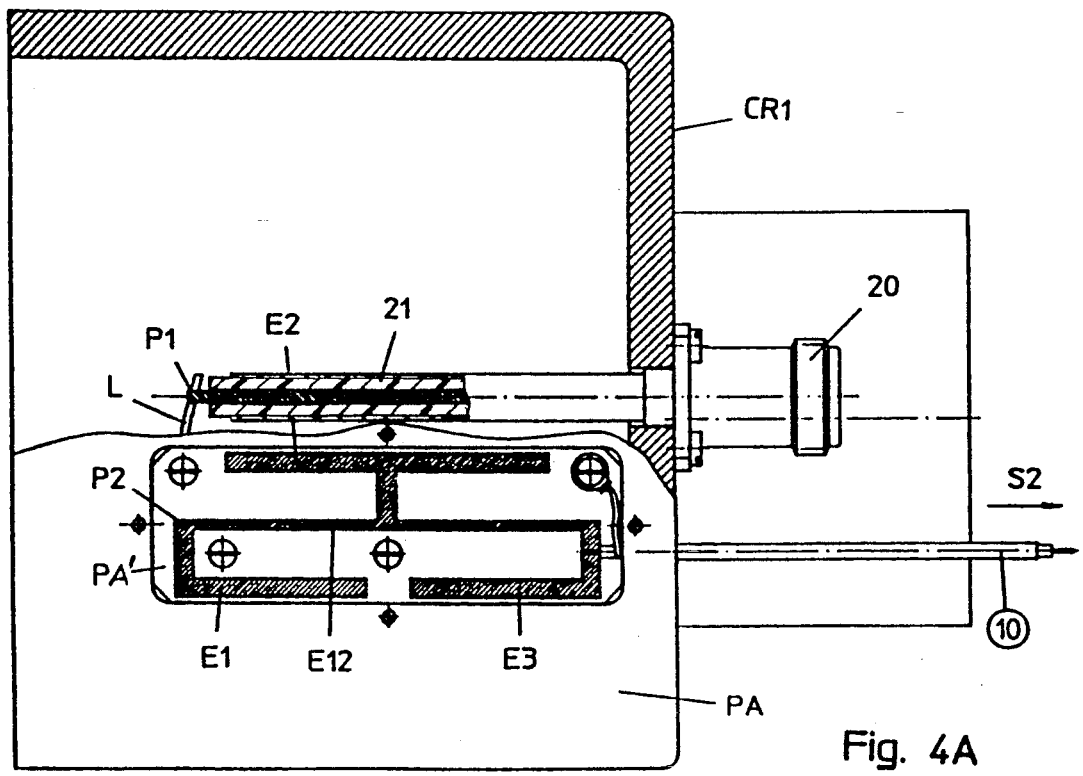
FIG. 4A is a partial section view of FIG. 4.

In the embodiment of FIG. 4, printed circuit CST is secured by screws to the wall of the cavity CR1, the wall shielding the printed circuit from the electromagnetic fields existing inside of CR1, thereby avoiding undesirable couplings.

Finally, the printed circuit is joined to a coaxial cable 10 that forms the output U of the low frequency signal S2.

In an alternative embodiment, the printed circuit might be housed in the inside of the cavity CR1, but in this case it would be necessary to add a shield to avoid undesirable couplings between the printed circuit and the electromagnetic fields existing in the cavity CR1.

The device can also operate without a shield, but probably with degraded characteristics.

Figure 1A:
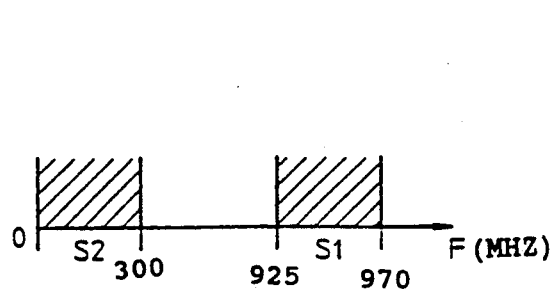
FIG. 1a shows the frequency bands of the composite signal.
Figure 1B:
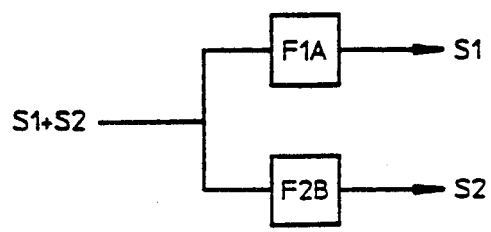
Figure 2:
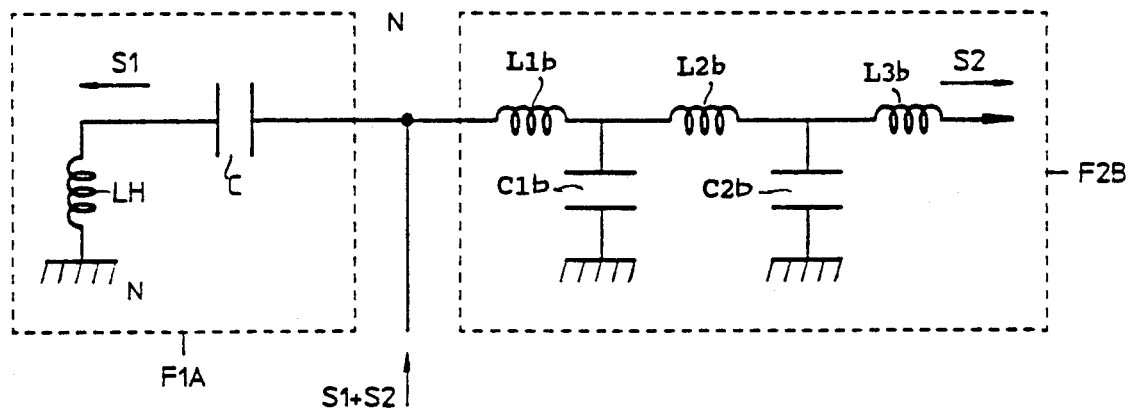

In all preceding embodiments, the filter F2B is located downstream of the inductance L, whereby the high frequency signal S1 is coupled to the filter F1A. This eliminates the need for the capacitor C of the known techniques (FIG. 2), thereby reducing the capacitance of the circuit. Furthermore, the position occupied by filter F2B and the absence of the capacitance C reduce the energy loss suffered by the high frequency signal S1.

Figure 5A:
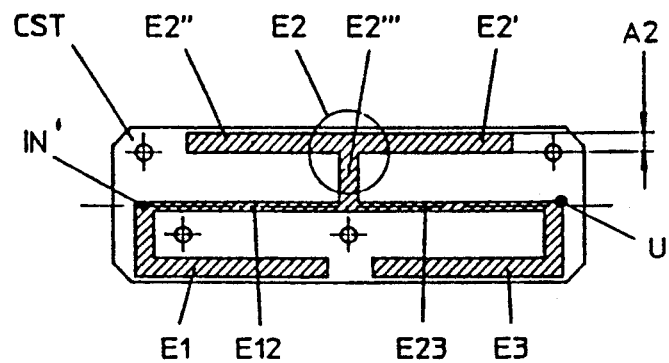
FIG. 5A is a front view, also in enlarged scale, of the single printed circuit of the present invention.

FIG. 5A represents the printed circuit CST in an enlarged scale for allowing a better comprehension of the disposition of stubs (E1, E2, E3 ... En) and connection tracks E12, E23, etc. that can differ from the simple configuration shown. For example, E2 is represented as formed of symmetrical pieces E2', E2'', E2''', e.g. having a thickness A2.

The various pieces can have different shapes, and some can even be eliminated; e.g. E2'' can be eliminated and the thickness A2 of E2' can be correspondingly increased. IN' indicates the input in F2B and U indicates the output by the cable 10. IN' is also the point in which a type of short circuit occurs for S1 that is facilitated by its total coupling with the resonator CR1.

Figure 5:
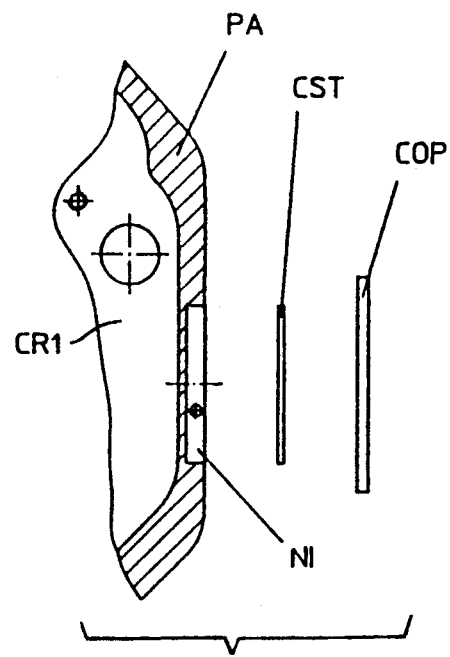
FIG. 5 is a partial section view, similar to the section of FIG. 4A, but in enlarged scale, limited to a recess formed in the wall PA of the cavity CR1, in which the printed circuit CST, covered by a proper protection cover COP, is inserted.

FIG. 5 shows an exploded view of the recess N1 formed in the wall PA of CR1, in which the printed circuit CST is, installed, that is in turn, protected by the external cover COP.

As previously mentioned, among the most important advantages obtained by the system of the invention are: (1) elimination of the capacitance C of the prior art, in particular the elimination of the capacitance of the high frequency filter; (2) the system capacitance now present only in F2B, is reduced to the distributed capacitances of the tracks E12, E23, with respect to ground; (3) the location of F2B downstream from F1A, preventing the high frequency signal from crossing F2B and causing damage; and (4) the low cost of the printed circuit embodiment of F2B, and its advantageous installation in a recess formed in the wall of CR1 (resulting in a reduction of size).

In this manner, the circuit characteristics are optimized to "maximum" value with respect to the reduction of losses, costs and overall dimensions. These advantages become especially critical and can be better appreciated if reference is made to the type of the tuning devices and band couplers used for telecommunication circuits in mobile apparatus. Indeed, in these devices, the tuning of resonators over wide bands is very important and can be solved using a cavity of the type CR1 that can be tuned by a female dielectric coupled with a male dielectric; the cavity with double dielectrics is the subject of U.S. application Ser. No. 07/810,729, now U.S. Pat. No. 5,206,612 while the configurations of each cavity (in bottle form), and the configuration of many cavities with one another (the first turned 180° with respect to the other one) are the subject of European Patent Application No. 0 492 304.

Although the present invention has been described in relation to particular embodiments thereof, many other variations and modifications and other uses will become apparent to those skilled in the art. It is preferred, therefore, that the present invention be limited not by the specific disclosure herein but only by the appended claims.

I claim:

1. A filtering system for separating two signals in difference frequency bands contained in a composite signal, a first one of the two signals to be separated being a low frequency signal in a frequency band extending from dc to 300 MHz, a second one of the two signals being a high frequency signal in a frequency band extending from 600 MHz to 15 GHz, said system comprising:

a high frequency filter for receiving the composite signal to be separated, the high frequency filter being non-capacitive and including an inductive element through which both the high frequency signal and the low frequency signal pass, the high frequency signal being coupled from said inductive element to a resonant element of the high frequency filter by mutual induction therebetween, such that only the low frequency signal is transmitted to a low-pass filter, thereby avoiding undesirable effects caused by the passage of the high frequency signal into said low-pass filter.

2. The system according to claim 1, wherein the resonant element comprises a cavity with an interior, and the coupling by mutual induction between the high frequency signal and the resonant element is carried out by the inductive element, said inductive element being disposed inside of the resonator.

3. The system according to claim 2, wherein, to optimize the coupling by mutual induction of the high frequency signal travelling through the inductive element inside of the resonator, the inductive element is connected to ground through an element of the low-pass filter.

4. The system according to claim 3, wherein said element of the low-pass filter has a length equal to one fourth of the wavelength of the high frequency signal.

5. A filtering system for separating two signals in different frequency bands contained in a composite signal, a first one of the two signals to be separated being a low frequency signal in a low frequency band, a second one of the two signals being a high frequency signal in a high frequency band, comprising:

first filter means comprising an inductor disposed within a resonant cavity for inductively coupling only the high frequency signal; and second filter means coupled to said first filter means and comprising a plurality of stubs each having respective first ends electrically coupled to an end of said inductor, said stubs being disposed on a printed circuit board, said stubs each having a length equal to one quarter wavelength of the high frequency signal and each stub being separated by a distance equal to one quarter wavelength of the high frequency signal, said second filter means transmitting only the low frequency signal passing through said first filter means.

6. A composite filter system for separating a composite signal comprising a low frequency signal and a high frequency signal, said system including two sections, a first one of the two sections being a high frequency bandpass filter and a second one of the two sections being a low-pass filter, wherein:

said high frequency bandpass filter comprises an input inductance and a resonant cavity magnetically coupled with the inductance, and said low-pass filter comprises a printed circuit including a plurality of stubs, said stubs each having a length of one fourth of the wavelength of the high frequency signal, said stubs each having a first end electrically coupled to said inductance of said high frequency bandpass filter.

7. The composite filter according to claim 6, wherein said stubs are each open circuited at a second end opposite to the inductance and are joined to one another at said first end by high impedance track sections, each of said sections having a length equal to one fourth of the wavelength of the high frequency signal.

8. The filter according to claim 6, wherein said composite signal passes first through the high frequency bandpass filter comprised of the cavity and the inductance and then through the low frequency bandpass filter comprising the printed circuit with the stubs joined by the tracks, the high frequency signal being filtered out by said high frequency bandpass filter and not entering low frequency bandpass filter.

9. The filter according to claim 6, wherein the printed circuit is disposed in a recess comprised as a part of a wall of the cavity.

10. The filter according to claim 9, wherein the inductance comprised of a coil having first and second terminals, the second terminal crossing through the cavity wall to contact a stub of the printed circuit and the first terminal being coupled to the end of a coaxial cable which carries an input signal to be filtered and penetrates to the inside of the cavity through a cavity wall.

* * * * *